(12) United States Patent
Carter et al.

(10) Patent No.: US 9,203,206 B2
(45) Date of Patent: Dec. 1, 2015

(54) THERMAL LOCKER

(71) Applicant: Oclaro, Inc., San Jose, CA (US)

(72) Inventors: Andrew Cannon Carter, Blisworth (GB); Barrie Flintham, Totnes (GB); Adrian Perrin Janssen, Exwick (GB); Colin Smith, Paignton (GB)

(73) Assignee: Oclaro Inc., San Jose, CA (US)

( * ) Notice: Subject to any disclaimer, the term of this patent is extended or adjusted under 35 U.S.C. 154(b) by 0 days.

(21) Appl. No.: 13/920,904

(22) Filed: Jun. 18, 2013

(65) Prior Publication Data

US 2014/0369368 A1  Dec. 18, 2014

(51) Int. Cl.
| | |
|---|---|
| H01S 3/10 | (2006.01) |
| H01S 3/11 | (2006.01) |
| H01S 3/107 | (2006.01) |
| H01S 3/13 | (2006.01) |
| H01S 5/06 | (2006.01) |
| H01S 5/068 | (2006.01) |
| H01S 5/0687 | (2006.01) |

(52) U.S. Cl.
CPC . *H01S 3/10* (2013.01); *H01S 3/107* (2013.01); *H01S 3/1106* (2013.01); *H01S 3/1305* (2013.01); *H01S 5/0612* (2013.01); *H01S 5/0617* (2013.01); *H01S 5/0687* (2013.01); *H01S 5/06804* (2013.01)

(58) Field of Classification Search
CPC ..... H01S 3/1003; H01S 3/107; H01S 3/1106; H01S 3/1305; H01S 5/065
USPC ........................ 372/20, 21, 26, 29.02, 78, 100
See application file for complete search history.

(56) References Cited

U.S. PATENT DOCUMENTS

| | | | | |
|---|---|---|---|---|
| 4,443,881 | A * | 4/1984 | Northcutt | 373/130 |
| 6,667,998 | B1 * | 12/2003 | Lo et al. | 372/34 |
| 6,693,928 | B2 * | 2/2004 | May | 372/19 |
| 6,763,047 | B2 * | 7/2004 | Daiber et al. | 372/34 |
| 6,822,996 | B1 * | 11/2004 | Pace et al. | 372/109 |
| 6,853,654 | B2 * | 2/2005 | McDonald et al. | 372/20 |
| 7,027,470 | B2 * | 4/2006 | May | 372/20 |
| 7,061,946 | B2 * | 6/2006 | Sochava et al. | 372/20 |
| 7,403,679 | B2 * | 7/2008 | McDonald et al. | 385/27 |
| 7,460,567 | B2 * | 12/2008 | May | 372/18 |
| 8,238,015 | B2 | 8/2012 | Finot et al. | |
| 2006/0039421 | A1 * | 2/2006 | Huang | 372/20 |
| 2012/0075636 | A1 * | 3/2012 | Zilkie | 356/454 |
| 2012/0224595 | A1 * | 9/2012 | Caprara | 372/22 |

OTHER PUBLICATIONS

International Search Report and Written Opinion for International Application No. PCT/US2014/41395, Dec. 24, 2014, 15 pages.

* cited by examiner

*Primary Examiner* — Xinning Niu
*Assistant Examiner* — Vu A Vu
(74) *Attorney, Agent, or Firm* — Fenwick & West LLP

(57) ABSTRACT

An assembly includes an etalon assembly for dynamically locking a frequency of an optical beam to a set frequency, the etalon assembly being external to a laser source assembly that outputs the optical beam. The etalon assembly includes an etalon that receives the optical beam and generates via interference effects a transmission beam, the etalon having a thermal tuning range greater than one half of a free spectral range of the etalon. The etalon assembly also includes an etalon heater mounted to the etalon such that the etalon heater is configured to adjust the temperature of the etalon. The assembly includes a controller configured to retrieve calibration data based on the set frequency, calculate a set temperature for the etalon using a thermal tuning algorithm and the calibration data, and control the etalon heater such that the etalon has a temperature equal to the calculated set temperature.

19 Claims, 9 Drawing Sheets

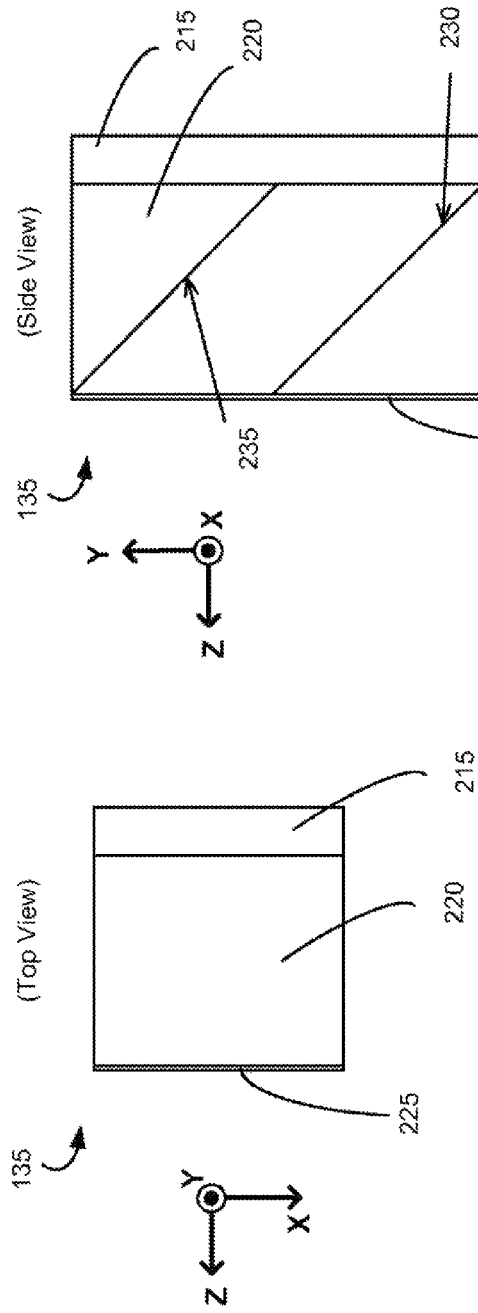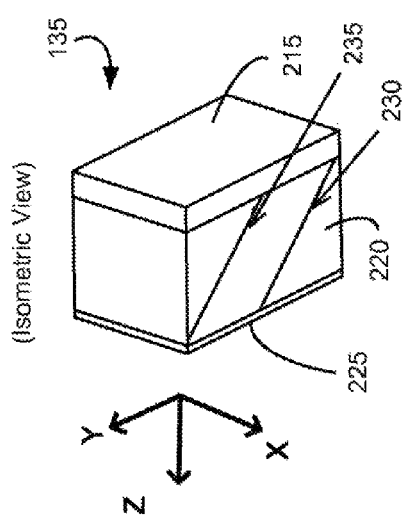

THERMAL LOCKER

BACKGROUND

1. Field of Disclosure

This disclosure relates to the field of controlling a frequency of laser source generally, and specifically to using a thermal locker assembly to allow dynamic locking of the frequency of the laser source to any frequency within a frequency grid.

2. Description of the Related Art

In fiber-optic communication channels it is common to use Dense Wavelength Division Multiplexing (DWDM) to transmit multiple optical signals via a single fiber. For DWDM applications each of these optical signals are tuned to a distinct frequency that corresponds to a particular channel. The channels are defined using a frequency grid (e.g., ITU-T G.694.1).

The frequencies of the optical signals produced by the laser sources are generally "locked" to their respective grid locations via a wavelength locking mechanism. In these instances, each wavelength locking mechanism is calibrated to lock a laser source to a specific frequency on a frequency grid. Additionally, these wavelength locking mechanisms generally are thermally stabilized such that no variation in temperature occurs which may cause the wavelength locking mechanism to detune from the specific frequency. Accordingly, present wavelength locking mechanisms lack flexibility in that they are unable to dynamically lock the optical output of a laser source to different frequencies, including frequencies that are off grid (i.e., a frequency that is not associated with a channel on a frequency grid).

SUMMARY

In one embodiment, an assembly includes an etalon assembly for dynamically locking a frequency of an optical beam to a set frequency, the etalon assembly being external to a laser source assembly that outputs the optical beam. The etalon assembly includes an etalon that receives the optical beam and generates via interference effects a transmission beam, the etalon having a thermal tuning range greater than one half of a free spectral range of the etalon. The etalon assembly also includes an etalon heater mounted to the etalon such that the etalon heater is configured to adjust the temperature of the etalon. The assembly includes a controller configured to retrieve calibration data based on the set frequency, calculate a set temperature for the etalon using a thermal tuning algorithm and the calibration data, and control the etalon heater such that the etalon has a temperature equal to the calculated set temperature.

In another embodiment a computer-implemented method for controlling an etalon assembly, comprises receiving a set frequency. Calibration data is retrieved based on the set frequency. A set temperature for an etalon is calculated using a thermal tuning algorithm and the calibration data, wherein a thermal tuning range of the etalon is greater than one half of a free spectral range of the etalon. The etalon assembly is controlled such that the etalon has a temperature equal to the calculated set temperature to dynamically lock a frequency of an optical beam to the set frequency.

In yet another embodiment, an assembly includes a laser source assembly, a redirection assembly, a reference detector, an etalon assembly, a transmission detector, and a controller. The laser source assembly produces an output beam at an initial frequency, where the initial frequency is dependent on one or more laser parameters. The redirection assembly that splits an output beam into a reference beam and a redirected beam. The reference detector that monitors the reference beam, producing a reference signal proportional to the optical intensity of the reference beam. The etalon assembly includes an etalon that receives the redirected beam and generates via interference effects a transmission beam, and the transmission beam being dependent on a temperature of the etalon. The etalon assembly also includes an etalon heater that adjusts the temperature of the etalon. The transmission detector monitors the transmission beam, producing a transmission signal proportional to the optical intensity of the transmission beam. The controller is configured to control the laser source assembly in accordance with the one or more laser parameter settings, such that the initial frequency is at or near a set frequency. The controller is also configured to determine a temperature of the etalon that corresponds to the set frequency, and control the etalon heater such that the etalon is at the determined temperature. The controller is also configured to calculate a lock ratio using the reference signal and the transmitted signal, and adjust one or more of the one or more laser parameters until the lock ratio corresponds to a calibrated lock ratio for the set frequency.

BRIEF DESCRIPTION OF DRAWINGS

FIG. 3A shows a top view of the redirection assembly used in FIG. 1 according to an embodiment.

FIG. 3B shows a side view of the redirection assembly used in FIG. 1 according to an embodiment.

FIG. 3C shows an isometric view of the redirection assembly used in FIG. 1 according to an embodiment.

DETAILED DESCRIPTION

The Figures (FIGS.) and the following description describe certain embodiments by way of illustration only. One skilled in the art will readily recognize from the following description that alternative embodiments of the structures and methods illustrated herein may be employed without departing from the principles described herein. Reference will now be made in detail to several embodiments, examples of which are illustrated in the accompanying figures. It is noted that wherever practicable similar or like reference numbers may be used in the figures and may indicate similar or like functionality.

Figure 1:
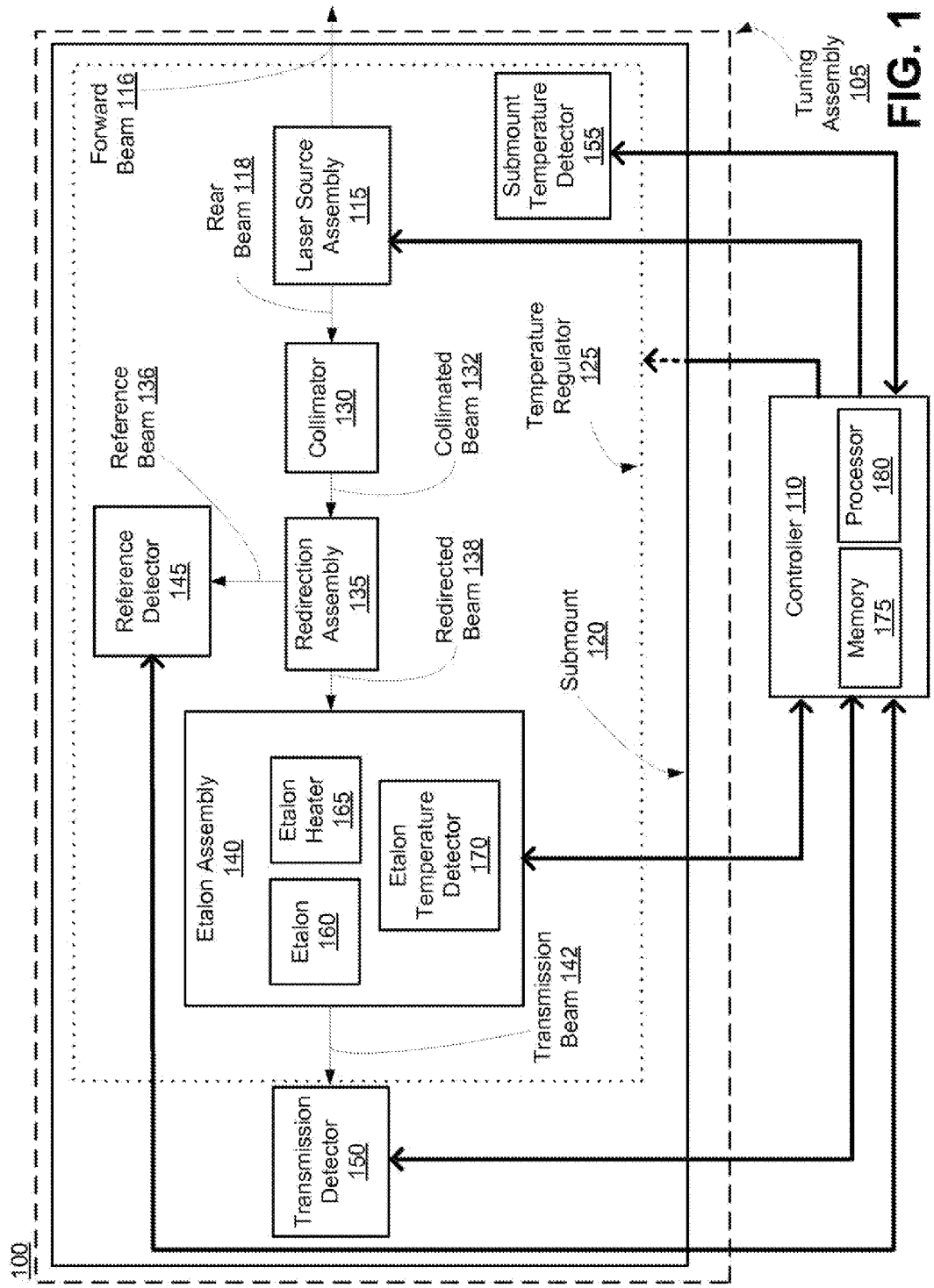
FIG. 1 is a block diagram of a thermal locker system according to an embodiment.

FIG. 1 is a block diagram of a thermal locker system 100 according to an embodiment. The thermal locker system 100 includes a tuning assembly 105 and a controller 110. The thermal locker system 100 generates an optical beam that is locked to a particular frequency (i.e., the set frequency) in accordance with instructions from the controller 110. Additionally, the set frequency of the beam may be dynamically adjusted such that beam of optical radiation is locked to different frequency values across a frequency band. A frequency band, may be, for example, the conventional wavelength window, known as the C-band, that covers 1.53-1.57 µm (191083-196078 GHz), the L-band, that covers 1.565-1.625 µm (184615-191693 GHz), etc. The thermal locker system 100 is able to dynamically lock its output beam to a frequency of the user's choosing (e.g., set frequency). Additionally, the frequency may be on or off grid. An on-grid frequency is associated with a particular channel of a frequency grid, an off-grid frequency is not associated with a channel on the frequency grid.

The tuning assembly 105 includes a laser source assembly 115, a submount 120, a temperature regulator 125, a collimator 130, a redirection assembly 135, an etalon assembly 140, a reference detector 145, a transmission detector 150, and a submount temperature detector 155.

The laser source assembly 115 produces one or more output beams (e.g., a forward beam 116 and a rear beam 118) of optical radiation at a particular frequency. The forward beam 116 may be provided to an external assembly (e.g., a transmitter). The rear beam 118 is used by the thermal assembly system 100 to identify the frequency of the forward beam 116 and ensure it remains locked to a particular frequency. In alternate embodiments, the forward beam 116 in combination with a beam splitting element may be used by the thermal assembly system 100 to identify the frequency of the forward beam 116.

To produce the output beam(s), the laser source assembly 115 includes one or more laser chips (e.g., laser diodes). Additionally, one or more of the laser chips may be composed of a plurality of sections. For example, the laser source assembly 115 may contain a single monolithic laser chip composed of a plurality of sections. The sections are different parts of the laser chip, e.g., the gain media, tuning, phase, amplifier, etc. The one or more laser chips may be chosen to produce frequencies of optical radiation useful for particular applications. For example, for some telecommunication applications, the frequencies of the optical radiation produced by the one or more laser chips may be spread across the C-band. The laser source assembly 115 is coupled to the controller 110. The frequency of the beams 116 and 118 depend on the temperature of the one or more laser chips and the amount of drive current in each chip (e.g., laser chip and/or one or more chip sections) receives from the controller 110.

The submount 120 includes one or more plates. Components (i.e., the laser source assembly 115, the collimator 130, the redirection assembly 135, the etalon assembly 140, the reference detector 145, the transmission detector 150, the submount temperature detector 155, and the temperature regulator 125) of the tuning assembly 105 are mounted to the one or more plates. The one or more plates provide mechanical stability and may assist with thermal management of one or more of the components. Additionally, one or more of the plates are thermally conductive. In this embodiment, at least the laser source assembly 115 is mounted to a thermally conductive plate. In some embodiments, the etalon assembly 140 may be mounted on a thermally insulated plate. Thermally conductive plates may be composed of a stable, thermally conductive material (e.g., Aluminum Nitride), and thermally insulated plates may be composed of a stable thermally insulating material. In one embodiment, the laser source assembly 115, the collimator 130, the redirection assembly 135, the etalon assembly 140, the reference detector 145, the transmission detector 150, the submount temperature detector 155, are mounted on one surface of the submount 120, and the temperature regulator 125 is mounted to the opposite surface of the submount 120.

The temperature regulator 125 includes one or more temperature regulation devices. A temperature regulation device may be used to cool and/or heat some, or all of, the submount 120 in order to regulate the temperature of one or more of the components mounted to thermally conductive portions of the submount 120. A temperature regulation device may be, for example, a thermoelectric cooler. The temperature regulator 125 is coupled to the controller 110 to receive signals from the controller 110 that cause the temperature regulator 125 to cool and/or heat some, or all of, the submount 120.

The submount temperature detector 155 monitors the temperature of the submount 120 and produces a corresponding output signal that corresponds to the temperature of the submount. In one embodiment, the temperature of the submount 120 is indicative of one or more components mounted to thermally conductive portions of the submount 120. For example, the temperature of the submount 120 may be indicative of the temperature of a laser source assembly 115 mounted to a thermally conductive portion of the submount 120. Additionally, any offset in measured temperature and the actual temperature of the laser source assembly 115 may be accounted for during calibration. The submount temperature detector 155 may be, for example, a thermistor, thermocouple, etc. The submount temperature detector 155 is coupled to the controller 110 to provide signals indicative of the temperature of the submount 120.

The collimator 130 includes one or more optical elements. The one or more optical elements are used to collimate the rear beam 118, resulting in a collimated beam 132. The one or more optical elements may include one or more aspherical and/or spherical lenses designed to collimate the beam in a manner that minimizes wavefront distortion.

The redirection assembly 135 splits the collimated beam 132 into a reference beam 136 and a redirected beam 138. In one embodiment, the redirection assembly 135 comprises a polarizing beam splitter that splits the collimated beam 132 into the reference beam 136 and the redirected beam 138. Additionally, in some embodiments, the redirection assembly 135 may also be configured to vertically offset the redirected beam 138 from the reference beam 136 with respect to the submount 120 (i.e., periscope configuration). The periscope configuration helps reduce the form factor of the tuning assembly 105, as it reduces the amount of space used on the submount 120. Additionally, in some embodiments, the redirection assembly 135 may include a polarizer on a surface of the redirection assembly 135 the collimated beam 132 is incident, and a quarter-wave plate on the opposite surface. The function of the polarizer and the quarter-wave plate is discussed below with respect to FIG. 2.

The etalon assembly 140 receives the redirected beam 138 and generates via interference effects a transmission beam 142. The etalon assembly 140 includes an etalon 160, an etalon heater 165, and an etalon temperature detector 170.

The etalon 160 is an interferometric element that generates a periodic output (i.e., the transmission beam 142) from the redirected beam 138, such that the transmission beam 142 changes with the frequency of the laser and the temperature of the etalon 160. The etalon 160 has an entrance surface (first surface) and an exit surface (second surface). The etalon may be composed of glasses, one or more crystals, or some combination thereof. In one embodiment, the exit surface is opposite the entrance surface, with both surfaces prepared to high geometric tolerances to create a precision optical cavity. Additionally, in some embodiments, the entrance surface and/or the exit surface may be optically coated. The conditions for constructive & destructive interference or resonance within the cavity are defined by the order of interference and the optical path length (OPL) of the element with parameters of refractive index, thickness, and incident beam angle. The transmission beam 142 can be defined by the location and width of the transmission maxima (i.e. resonant peaks). More specifically the difference in frequency from one peak to the next is called Free Spectral Range (FSR) and the width of the peaks are referred to as the Etalon Finesse being largely dependent on the selection of coating reflectivity of the two surfaces. A change in temperature of the etalon 160 changes both the refractive index of the element characterized by its thermo-optic coefficient (dn/dT) and the thickness of the cavity characterized by its thermal expansion coefficient ($\alpha$). The resultant change in optical path length (OPL) changes the location of the resonant peaks, providing a frequency shift with temperature (dv/dT) within the transmission beam 142

In general, the material for the etalon 160 should have good mechanical properties (e.g., stable and easy to fabricate); have a high change in frequency/change in temperature $$\left(\frac{d\upsilon}{dT}\right),$$

but not high enough to create control sensitivity problems; and have a high thermal conductivity ($\kappa$) to create a uniform thermal profile across the etalon 160. For example, the etalon 160 may be composed of a material that is stable, with a $$\frac{d\upsilon}{dT}$$

within the range (2 to 4 GHz/C), and a $\kappa$ in excess of 10 W/m·K. In some embodiments, the etalon 160 may be composed of a single yttrium aluminum garnet ("YAG") crystal. YAG has a $$\frac{d\upsilon}{dT} \text{ of } \sim 2.2 \text{ GHz/C}.$$

and a $\kappa$ of $$\sim 12.9 \text{ Wm}^{-1}\text{K}^{-1}.$$

In contrast, silicon is too sensitive to changes in temperature $$\left(\frac{d\upsilon}{dT} \text{ of } \sim 8.8 \text{ GHz/C,}\right)$$

making it require strict temperature control. And, sapphire, while having similar temperature sensitivity $$\left(\frac{d\upsilon}{dT} \text{ of } \sim 2.2 \text{ GHz/C.}\right)$$

is very difficult to machine to the required precision due to its hardness.

In some embodiments, the etalon 160 may be partially covered by a shroud. The shroud is used to maintain temperature uniformity across the etalon 160. The shroud may be a monolithic structure, or may be composed of multiple pieces. Additionally, in some embodiments, there may be one or more air gaps between the etalon 160 and the shroud, between pieces of the shroud, or some combination thereof. The shroud is composed a thermally conductive material and is mounted to the etalon heater 165. The shroud may be composed from, for example, a stable thermally conductive material (e.g., aluminum nitride, composite ceramics, copper or some other metal(s), etc.).

The etalon heater 165 heats the etalon assembly 140. The etalon heater 165 includes a thermally conductive mounting surface which the etalon 160, the shroud, and the etalon temperature detector 170 are mounted. The etalon heater 165 may be, for example, a thermo-electric cooler, a resistive heater, etc. The maximum temperature of the etalon heater 165 depends on the material composition of the etalon 160. For example, the etalon heater 165 may be configured to heat the etalon 160 to a maximum temperature of approximately 78° C. for an etalon 160 composed of YAG. In contrast, the etalon heater 165 would have to be configured to reach a maximum temperature of 95.8° C. for fused silica which would be impractical. Additionally, the response time and precision of the etalon heater 165 depend on the housing design and the material composition of the etalon 160. For example, for materials that are very sensitive to temperature changes $$\left(\text{i.e. high } \frac{d\upsilon}{dT}\right),$$

the etalon heater 165 has stricter requirements in terms of maintaining specific temperatures both in terms of control precision and compensating for external influences. The etalon heater 165 is coupled to the controller 110 to receive signals from the controller 110 that cause the etalon heater 165 to heat up and/or cool down to a specific temperature.

In some embodiments, the etalon assembly 140 includes an insulator that is mounted to the surface opposite the thermally conductive mounting surface. The insulator is composed of an insulating material and is used to isolate the temperature of the etalon 160 from the submount 120. The insulator may be composed of an insulating ceramic, glass, or some other stable insulating material. Additionally, in some embodiments, there may be one or more air gaps between portions of the etalon heater 165 and the insulator. The locations and size of the air gaps are determined to facilitate efficient and uniform thermal management of the etalon assembly 140.

The etalon temperature detector 170 monitors the temperature of the etalon heater 165 and produces a corresponding output signal. The etalon temperature detector 170 may be, for example, a thermistor, thermocouple, etc. In one embodiment, the etalon temperature detector 170 is mounted to the etalon heater 165. In other embodiments, the etalon temperature detector 170 may be mounted to the etalon 160, the shroud, or some other part of the etalon assembly 140. The etalon temperature detector 170 is coupled to the controller 110 to provide signals indicative of the temperature of the etalon 160. In embodiments, where the etalon temperature detector 170 is mounted to components other than the etalon 160, any offset in measured temperature and the actual temperature of the etalon 160 may be accounted for during calibration.

The reference detector 145 and the transmission detector 150 measure the intensity of incident optical radiation. The detectors 145 and 150 are photodiodes (e.g., p-i-n diodes). The reference detector 145 monitors the reference beam 136 and produces a corresponding output signal, $R_{xMon}$. The transmission detector 150 monitors the redirected beam 138 and produces a corresponding output signal, $T_{xMon}$. The signal strength of $R_{xMon}$ and $T_{xMon}$ are proportional to the optical intensities of the reference beam 136 and the redirected beam 138, respectively. The reference detector 145 and the transmission detector 150 are coupled to the controller 110 to provide the output signals $R_{xMon}$ and $T_{xMon}$, respectively, to the controller 110.

Controller 110 is configured to control the tuning assembly 105 such that the forward beam 116 and the rear beam 118 are output at a particular frequency, for example, a set frequency. The set frequency is the desired frequency of the optical beam 116 output from the laser source assembly 115. The controller 110 includes one or more memories 175 and one or more processors 180. In some embodiments, the controller 110 is composed of a plurality of sub-controllers that are coupled together. Where each of the sub-controllers control different aspects of the assembly 100. For example, there could be separate sub-controllers for the etalon heater 165 and the temperature regulator 125.

The controller 110 is configured to monitor signals, using the one or more processors 180, from the etalon temperature detector 170, the submount temperature detector 155, the reference detector 145, and the transmission detector 150. Signals from the etalon temperature detector 170 are indicative of the temperature of the etalon 160. Signals from the submount temperature detector 155 are indicative of the temperature of the laser source assembly 115. And as discussed above, the signals from the reference detector 145 and the transmission detector 150 are the $R_{xMon}$ and $T_{xMon}$, respectively.

The controller 110 is configured to drive, using the one or more processors 180, the laser source assembly 115, the temperature regulator 125, the etalon heater 165, to obtain a desired frequency of the forward beam 116 and the rear beam 118. These functions are described in detail below with reference to FIGS. 5-9. Additionally, the controller 110 may be configured to and bias the reference detector 145 and transmission detector 150.

The controller 110 includes one or more lookup tables that are, for example, stored in memory 175, and used by the controller 110 to adjust the tuning assembly 105 to produce and lock the forward beam 116 and the rear beam 118 at a particular frequency. The lookup tables include laser source assembly data that map combinations of the drive current provided to the laser source assembly 115 and measured temperatures from the submount temperature detector 155 to estimated output frequencies of the forward beam 116 and the rear beam 118.

The one or more lookup tables also include calibration data and one or more thermal tuning algorithms that may used by the controller 110 to adjust the temperature of the etalon 160 to a set temperature that corresponds to a set frequency. The one or more lookup tables may include calibrated lock ratio values and etalon temperature values for corresponding frequency values. The lock ratio is a function of the frequency, etalon temperature, submount temperature, and case temperature. Additionally, dependencies of submount temperature and case temperature may be accounted for during calibration. Thus, the lock ratio may generally be considered a function of frequency and etalon temperature. In one embodiment, the lock ratio (LR) may be defined as:

$$LR = \frac{TxMon}{R_{xMon}} \quad (1)$$

Equation (1) is a measure of the intensity the transmission beam 142 divided by the intensity of the reference beam 136 at a particular etalon temperature and frequency. Alternatively, the lock ratio may be defined in other ways, for example, as the difference in intensity between the beams divided by the sum of the beams.

A calibrated lock ratio for a specific set frequency and etalon temperature is known as a lock ratio set point. The lock ratio set point has a specific frequency value (i.e., set frequency) and a corresponding etalon response value. In some embodiments, the lock ratio set points are calibrated for etalon response values that occur such that the lock ratio set points intersect with a $T_{nom}$ response curve at equal spacings (see, e.g., FIG. 5). The spacing may be, for example, the free spectral range (FSR) divided by 2. In some embodiments, the spacing may be 50 GHz. Additionally, in some embodiments, the calibrated values of the lock ratio set points have etalon response values to maximize the etalon response to frequency changes. In embodiments, where the lock ratio set points are located at some other spacing, this results in an asymmetrical demand in etalon temperature about a calibration point. And as the operating temperature extremes of the etalon may be restricted this would potentially mean selecting alternative nominal temperatures for calibration.

As discussed in detail below, the controller 110 is configured to calculate a lock ratio, and compare it to a lock ratio set point to determine whether the frequency of the rear beam 118 and the forward beam 116 has shifted from the set frequency. The controller 110 is configured to adjust the temperature of the one or more laser chips and/or the drive current provided to the one or more laser chips to shift the beam frequency of the rear beam 118 and the forward beam 116 back to the set frequency.

Figure 2:
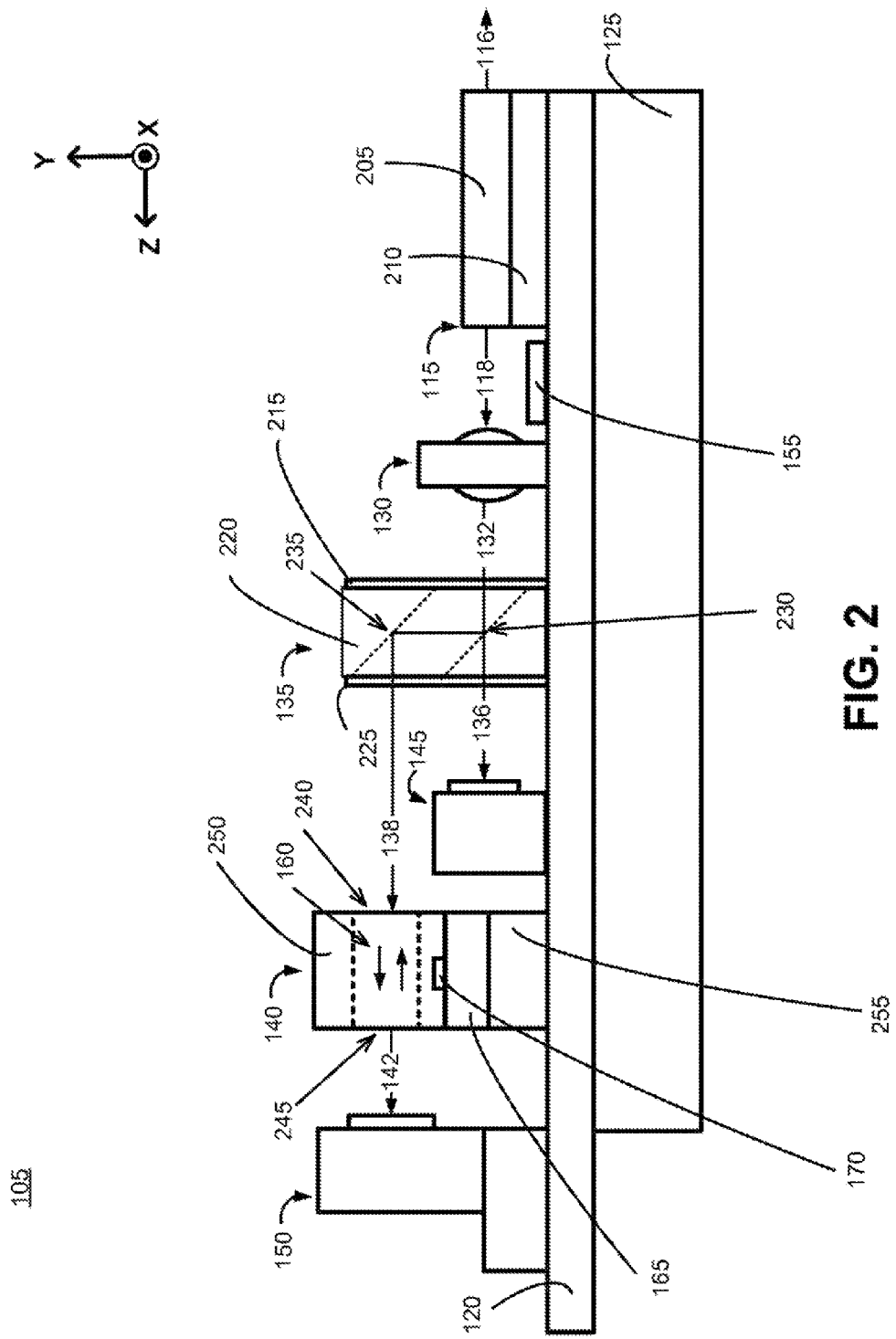
FIG. 2 is a tuning assembly from the thermal locker system used in FIG. 1 according to an embodiment.

FIG. 2 is a tuning assembly 105 from the thermal locker system 100 used in FIG. 1 according to an embodiment. The laser source assembly 105 includes a laser chip 205 that produces a forward beam 116 and a rear beam 118. In this embodiment, the laser chip 205 is mounted to a thermally conductive spacer 210. The rear beam 118 is collimated via the collimator 130 to produce a collimated beam 132.

The collimated beam 132 is incident on a beam redirection assembly 135. In this embodiment, the beam redirection assembly 135 includes a polarizer 215, a modified polarizing beam splitter 220, and a quarter-wave plate 225. The polarizer 215 is a linear polarizer oriented along the X axis, thus polarizing the collimated beam 132 along the X axis to create a polarized beam. The polarized beam is then incident on a first reflecting surface 230. The first reflecting surface 230 is configured to change the direction of a portion of the polarized beam by 90 degrees such that the reflected portion is propagating in the Y direction. Additionally, the first surface 230 is coated to transmit a portion of the polarized beam toward the quarter-wave plate 225. For example, the coating may be such that approximately 70% of the polarized beam is reflected and approximately 30% is transmitted. The portion of the polarized beam transmitted by the first reflecting surface 230 is rotated by 45 degrees via the quarter-wave plate 225 to form the reference beam 136. The reference beam 136 is then incident on the reference detector 145.

The portion of the polarized beam reflected by the first reflecting surface 230 is then incident on the second reflecting surface 235. The second reflecting surface 235 is coated with materials to maximize reflection of components of the polarized beam oriented along the X axis, and maximize transmission of components of the polarized beam that are polarized in a direction orthogonal to the X axis. The second reflecting surface 235 is configured to redirect the polarized beam in a direction parallel to the submount 120 (e.g., the Z direction) and set a vertical offset between the redirected beam 138 and the reference beam 136. This configuration, of the first reflecting surface 230 and the second reflecting surface 235 to provide a vertical offset between the redirected beam 138 and the reference beam 136, is a periscope configuration. The periscope configuration reduces the area needed on the submount 120 to mount components, and thus may reduce the form factor and/or the footprint of the tuning system 105. The portion of the polarized beam reflected by the second reflecting surface 235 is then rotated by 45 degrees via the quarter-wave plate 225 to form the redirected beam 138.

In this embodiment, the etalon assembly 140 includes an etalon 160, a shroud 250, an etalon heater 165, an etalon temperature detector 170, and an insulator 255. The redirected beam 138 is incident on a first surface 240 of the etalon 160. The first surface 240 is highly polished and parallel to a second surface 245 of the etalon 160 which is also highly polished creating the required optical cavity. Additionally, in some embodiments both the first surface 240 and the second surface 245 have one or more reflection coatings. The etalon 160 generates a transmission beam 142 from the redirected beam 138, such that the transmission beam 142 varies with frequency of the output beam(s) produced by the laser source assembly 115 and the temperature of the etalon 160. The transmission beam 142 is incident on a transmission detector 150.

The transmission beam 142 is dependent on the frequency of the output beam(s) produced by the laser source assembly 115 and temperature of the etalon. As discussed above, changes in etalon temperature change result in a change in the location of the resonant peaks, providing a frequency shift with temperature (du/dT) within the transmission beam 142.

In this embodiment, the shroud 250 surrounds portions of the etalon 160, while exposing the first surface 240 and the second surface 245. The shroud 250 is thermally conductive and helps maintain a uniform temperature profile across the etalon 160. The insulator 255 operates to insulate the etalon assembly 140 from the temperature of the submount 120 and the temperature regulator 125.

Note, some portion of redirected beam 138 may be reflected from the first surface 240, the reference detector 145, the transmission detector 150, or some combination thereof such that it propagates back along the beam path, this is known as a back reflection. Back reflections may cause undesirable noise components to be generated in the output of the laser source assembly 115. The function of the polarizer 215 and the quarter-wave plate 225 operate in conjunction to prevent back reflections from the etalon assembly 140 from coupling back into the laser chip 205 A back reflection is rotated an additional 45 degrees by the quarter-wave plate 225, accordingly, the back reflection is polarized along the Y direction and the polarizer 215 blocks the back reflection because the back reflection is orthogonal to the orientation of the polarizer (i.e., the X direction). Additionally, in some embodiments, one or more of the components of the tuning assembly 105 may be angled such that any back reflections or other reflections do not propagate back along the beam path. For example, the etalon assembly 140, the reference detector 145, the transmission detector 150, etc., may be angled to minimize the chances of a back reflection propagating back along the beam path. Additionally, in some embodiments, there may be one or more baffles (not shown) used to capture any back reflection or other reflection.

FIGS. 3A-3C illustrate different views of the redirection assembly 135. FIG. 3A illustrates a top view of the redirection assembly used in FIG. 1 according to an embodiment. FIG. 3B illustrates a side view of the redirection assembly 135 used in FIG. 1 according to an embodiment. FIG. 3C illustrates an isometric view of the redirection assembly 135 used in FIG. 1 according to an embodiment.

Figure 4A:
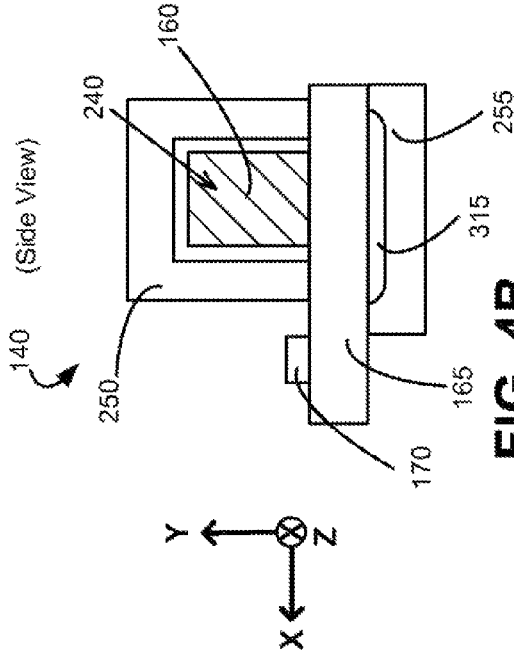
FIG. 4A shows a top view of the etalon assembly used in FIG. 1 according to an embodiment.
Figure 4B:
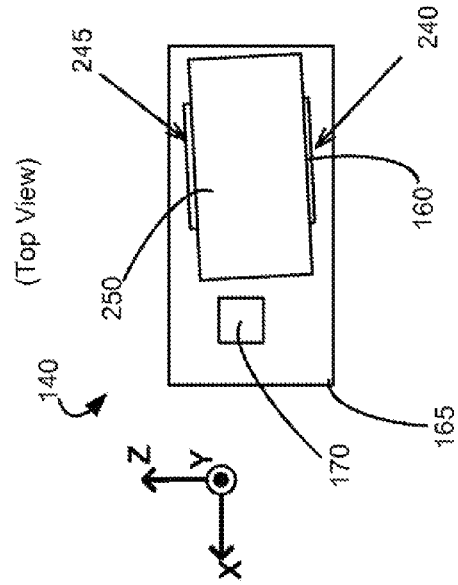
FIG. 4B shows a side view of the etalon assembly used in FIG. 1 according to an embodiment.
Figure 4C:
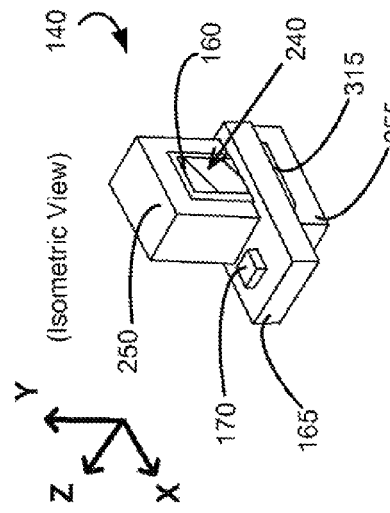
FIG. 4C shows an isometric view of the etalon assembly used in FIG. 1 according to an embodiment.

FIGS. 4A-4C illustrate different views of the etalon assembly 140. FIG. 4A illustrates a top view of the etalon assembly 140 used in FIG. 1 according to an embodiment. In this embodiment, the shroud 250 and the etalon 160 are slightly angled with respect to the Z axis to reduce back reflections. FIG. 3B illustrates a side view of the etalon assembly 140 used in FIG. 1 according to an embodiment. From this perspective, it is clear that the etalon assembly 140 also includes an insulator 255 that includes an air gap 315 that partially separates a portion of the insulator 225 from the etalon heater 165. FIG. 3C illustrates an isometric view of the etalon assembly 140 used in FIG. 1 according to an embodiment.

Thermal Tuning of the Etalon Assembly

Figure 5:
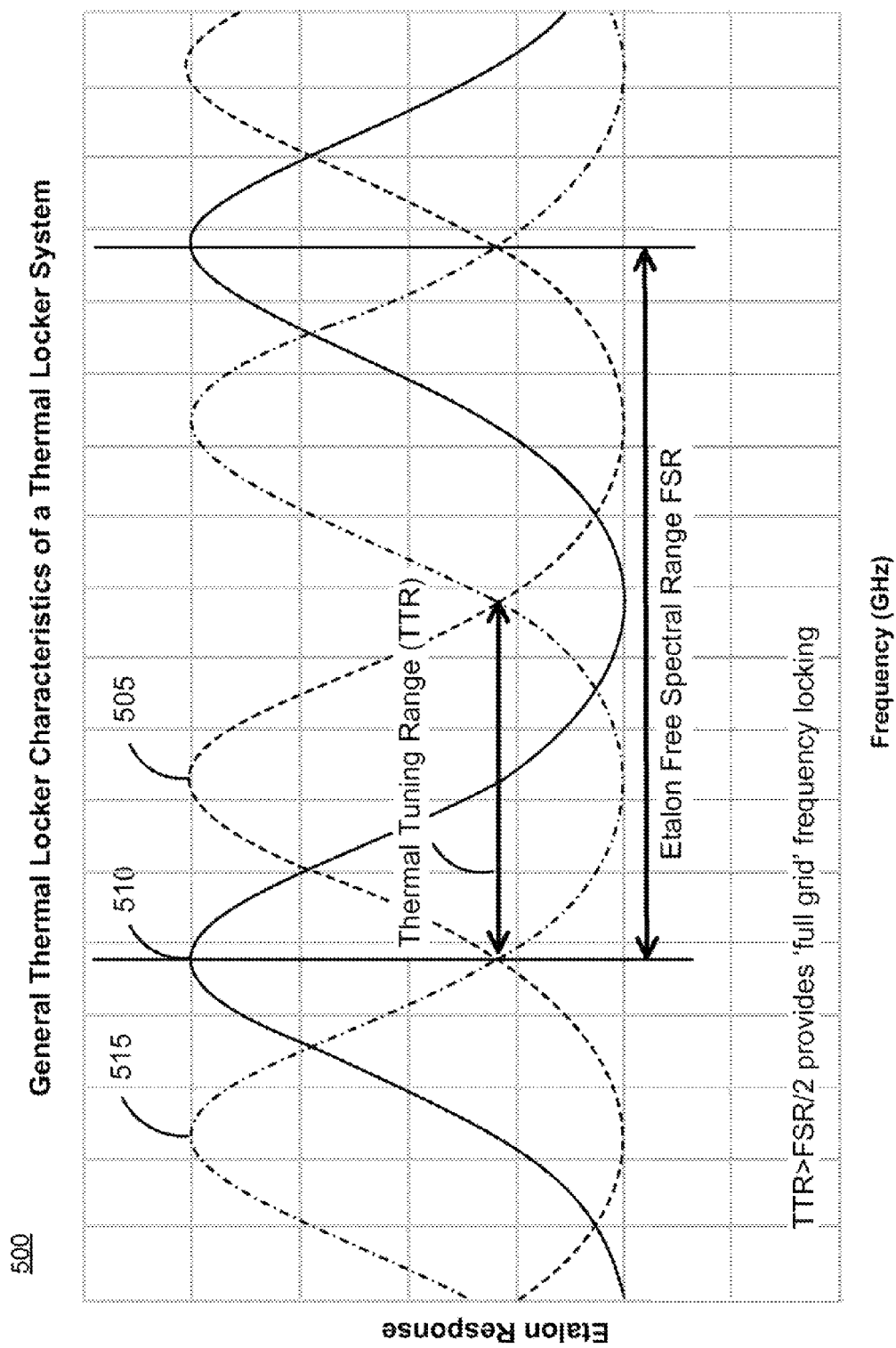
FIG. 5 is a graph depicting general thermal locker characteristics of a thermal locker system according to an embodiment.

FIG. 5 is a graph 500 depicting general thermal locker characteristics of the thermal locker system 100 according to an embodiment. The graph 500 includes an etalon response 505 for a calibration temperature ($T_{nom}$), an etalon response 510 at a maximum temperature ($T_{max}$), and an etalon response 515 at a minimum temperature ($T_{min}$). The Etalon Response axis is a measure of the etalon's transmission characteristics. The transmission characteristics may be determined by normalizing and plotting the transmitted beam 142 in the frequency domain when the etalon temperature is fixed to a particular value, e.g., $T_{nom}$, $T_{max}$, and $T_{min}$. The transmission beam 142 may be normalized by dividing the transmission beam 142 by an output beam of the laser source assembly 115 that has not passed through the etalon 160, e.g., the reference beam 136, the forward beam 116, etc. Graph 500 illustrates the etalon free spectral range (FSR) as the spacing between two maxima of the etalon response 510. Full grid thermal locking may occur because the thermal tuning range (TTR) is greater than the FSR/2. The thermal tuning range is the change in etalon response as the etalon temperature ranges from $T_{min}$ to $T_{max}$.

Figure 6:
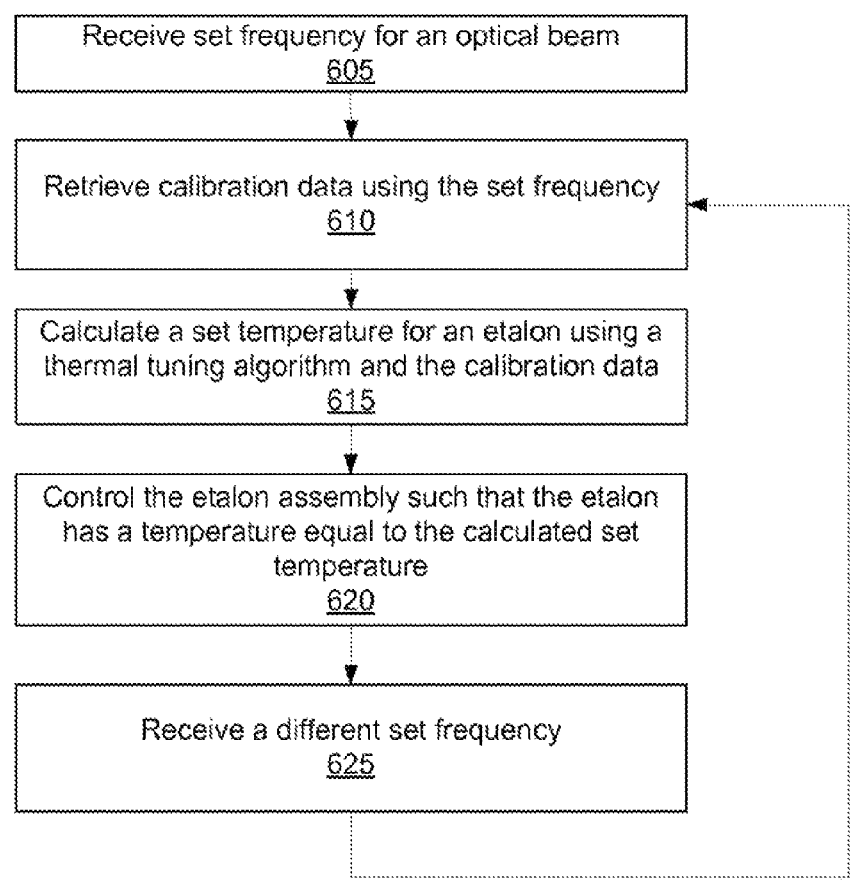
FIG. 6 illustrates a flowchart of one embodiment of a process for tuning an etalon assembly using a controller of a thermal locker system according to an embodiment.

FIG. 6 illustrates a flowchart of one embodiment of a process 600 for tuning an etalon assembly 140 using a controller 110 of a thermal locker system 100 according to an embodiment. Other entities may perform some or all of the steps of the process in other embodiments. Likewise, embodiments may include different and/or additional steps, or perform the steps in different orders.

In this embodiment, the controller 110 receives 605 a set frequency from a user. In alternate embodiments, the controller 110 receives the set frequency from a device.

The controller 110 retrieves 610 calibration data using the set frequency. Calibration data includes a calibration point and a calibration temperature ($T_{nom}$) associated with the calibration point. The assembly system 100 maintains a plurality of calibration points for different frequencies at a calibration temperature ($T_{nom}$). The calibration data points may be read directly from a look up table and/or, in some embodiments, calculated/interpolated from a limited set of look-up/cal points. The calibration points range over a frequency band of interest (e.g., C band). For simplicity the frequency band can be considered as being divided up into segments with a calibration point located within each segment. For example, if the frequency band covers 4800 GHz, and the thermal tuning range of the etalon 160 is 50 GHz, 96 or more segments ensure that the full band is covered.

In some of these embodiments, a calibration point falls within in each of the segments. In some embodiments, a calibration point is centered within each of the segments. In other embodiments, multiple calibration points may be within each segment. Additionally, in some embodiments, calibration points may be inferred from other segments. The controller 110 retrieves the calibration point that is nearest to the set frequency. In some embodiments, the calibration temperature is a temperature that falls within the thermal tuning range of the etalon 160. In some embodiments, the calibration temperature is a temperature that corresponds to the center of the thermal tuning range of the etalon 160. For example, the calibration temperature may be 65° C.

The controller 110 calculates 615 a set temperature for the etalon 160 using a thermal tuning algorithm and the retrieved calibration data. In one embodiment, the thermal tuning algorithm may be:

$$\upsilon_{i,j} = \upsilon_{i,0} + \frac{d\upsilon}{dT}(T_{nom} - T_j) \quad (2)$$

where $d\upsilon/dT$ is the etalon frequency change with temperature, $\upsilon_{i,0}$ is the frequency measured at the calibration temperature $T_{nom}$, $T_j$ is the temperature of the etalon 160, and $\upsilon_{i,j}$ is the set frequency. There are "i" calibration points across the band, and "j" is ±0, 1, ... n, where n is determined by the resolution of the etalon temperature detector 170.

Equation (2) is a fixed correction, however, it does not take into account the frequency dependence of the etalon's frequency change with temperature. Accordingly, in some embodiments, a frequency corrected thermal tuning algorithm may be used, specifically:

$$\upsilon_{i,j} = \upsilon_{i,0} + \frac{d\upsilon'}{dT}(T_{nom} - T_j) \quad (3)$$

$$\frac{d\upsilon'}{dT} = f(\upsilon) \quad (4)$$

where $f(\upsilon)$ could be a linear or non-linear function of frequency, for example a linear function $f(\upsilon)=m\upsilon+c$, where m and c are constants. Equation (3) is frequency corrected, however, it does not take into account a temperature offset from what is measured by the etalon temperature detector 170 and the actual temperature of the etalon 160. Alternatively, in some embodiments, a frequency and temperature corrected thermal tuning algorithm may be used, specifically:

$$\upsilon_{i,j} = \upsilon_{i,0} + \frac{d\upsilon'}{dT}(T_{nom} - T_j)(1 - \delta) \quad (5)$$

where $\delta$ is the temperature offset correction factor. The temperature offset correction factor is indicative of the offset between the actual temperature of the etalon 160 and the temperature of the etalon temperature detector 170 which scales with the temperature deviation from the calibration temperature. The temperature offset correction factor may be derived during calibration. Additionally, in some embodiments the thermal tuning algorithm may incorporate additional correction terms to compensate for other environmental factors. For example, the temperature of the submount 120, temperature of a case enclosing the tuning assembly 105, aging, etc.

The controller 110 controls 620 the etalon assembly such that the etalon 160 has a temperature equal to the calculated set temperature. The controller 110 adjusts the etalon heater 165 until the etalon temperature detector 170 indicates the monitored temperature as being the set temperature. The controller 110 may maintain the temperature of the etalon 160 at the set temperature via, e.g., a proportional-integral-derivative (PID) algorithm.

At some point, a user may want to change the set frequency to a different frequency value. For example, the user may wish to lock the thermal locker system 100 to a different frequency. The controller 110 receives 625 a different set frequency value, and then continues with steps 610-620 based on the different set frequency. Accordingly, the thermal locker system 100 is able to dynamically lock its output beam to a frequency of the user's choosing. Additionally, the frequency may be an on-grid frequency or an off-grid grid frequency.

Figure 7:
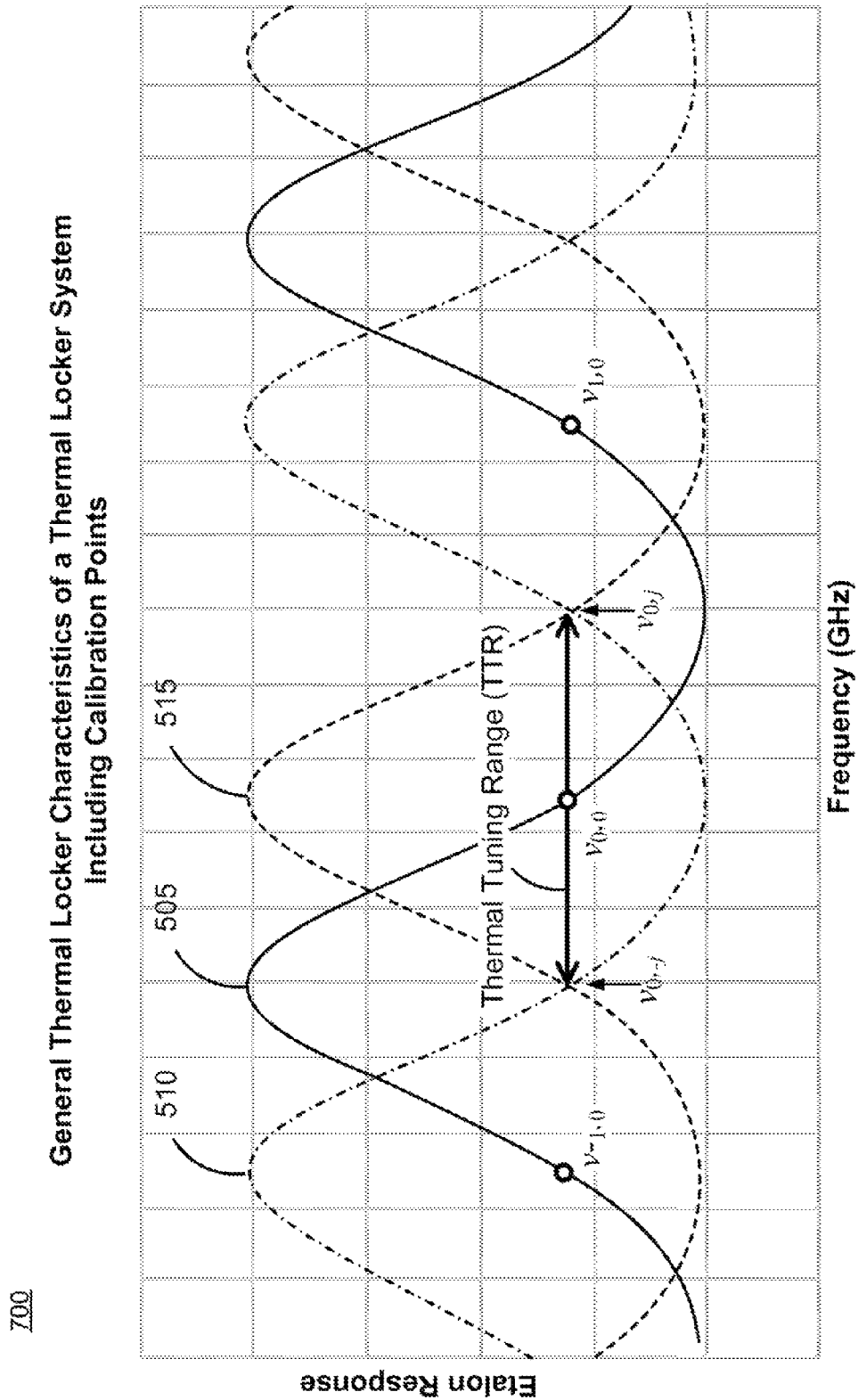
FIG. 7 is a graph depicting general thermal locker characteristics of a thermal locker system including calibration points according to an embodiment.

FIG. 7 is a graph 700 depicting general thermal locker characteristics of the thermal locker system 100 including calibration points according to an embodiment. The graph 700 includes the etalon response 505 for the calibration temperature ($T_{nom}$), the etalon response 510 at the maximum temperature ($T_{max}$), and the etalon response 515 at the minimum temperature ($T_{min}$). Graph 700 depicts three calibration points on the etalon response 505, specifically, $\upsilon_{-1,0}$, $\upsilon_{0,0}$, and $\upsilon_{1,0}$. As discussed above, with respect to FIG. 6, to tune the etalon 160 to the set frequency, the controller 110 chooses the calibration point that is nearest to the set frequency and then adjusts the temperature of the etalon 160 causing the etalon response curve 510 to shift to a set position that corresponds to the rear beam 116 and the forward beam 118 being at the set frequency. To tune a response curve to a higher frequency, the controller 110 reduces the temperature of the etalon 160, and to tune the response curve to a lower frequency, the controller 110 increases the temperature of the etalon 160.

Figure 8:
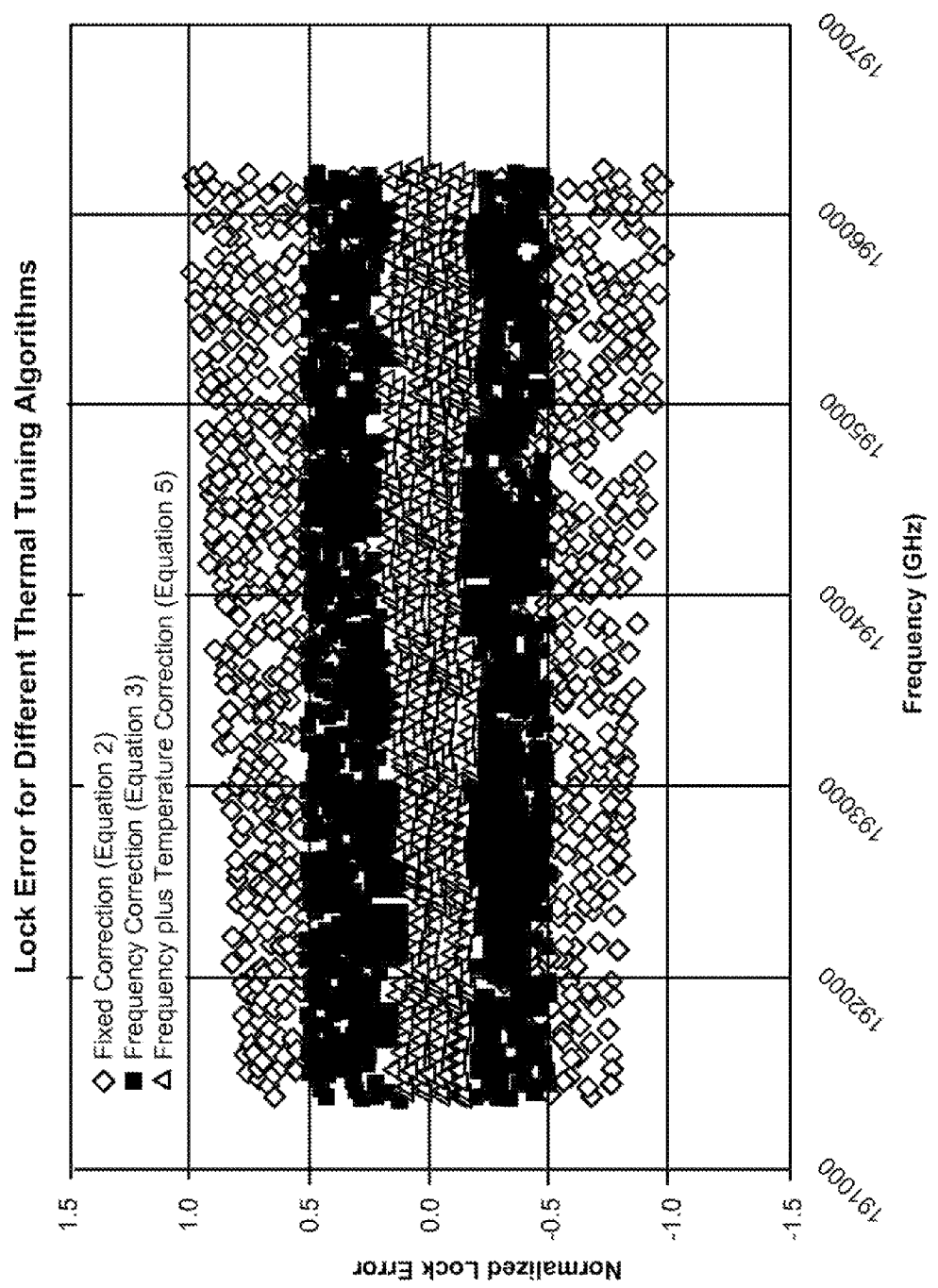
FIG. 8 is a graph depicting the lock error for different thermal tuning algorithms according to an embodiment.

FIG. 8 is a graph 800 depicting the lock error for different thermal tuning algorithms according to an embodiment. Specifically, the graph 800 illustrates how lock error is minimized when different tuning algorithms are used. As discussed above, equation 5 takes into account the temperature offset and is corrected for frequency. In contrast, equation 2 is a fixed correction, and equation 3 while being frequency corrected does not correct for temperature offset. The normalized locker error is the error that between the actual frequency of the beam and the frequency of the beam indicated via the etalon 160.

Operation of the Thermal Locker System

Figure 9:
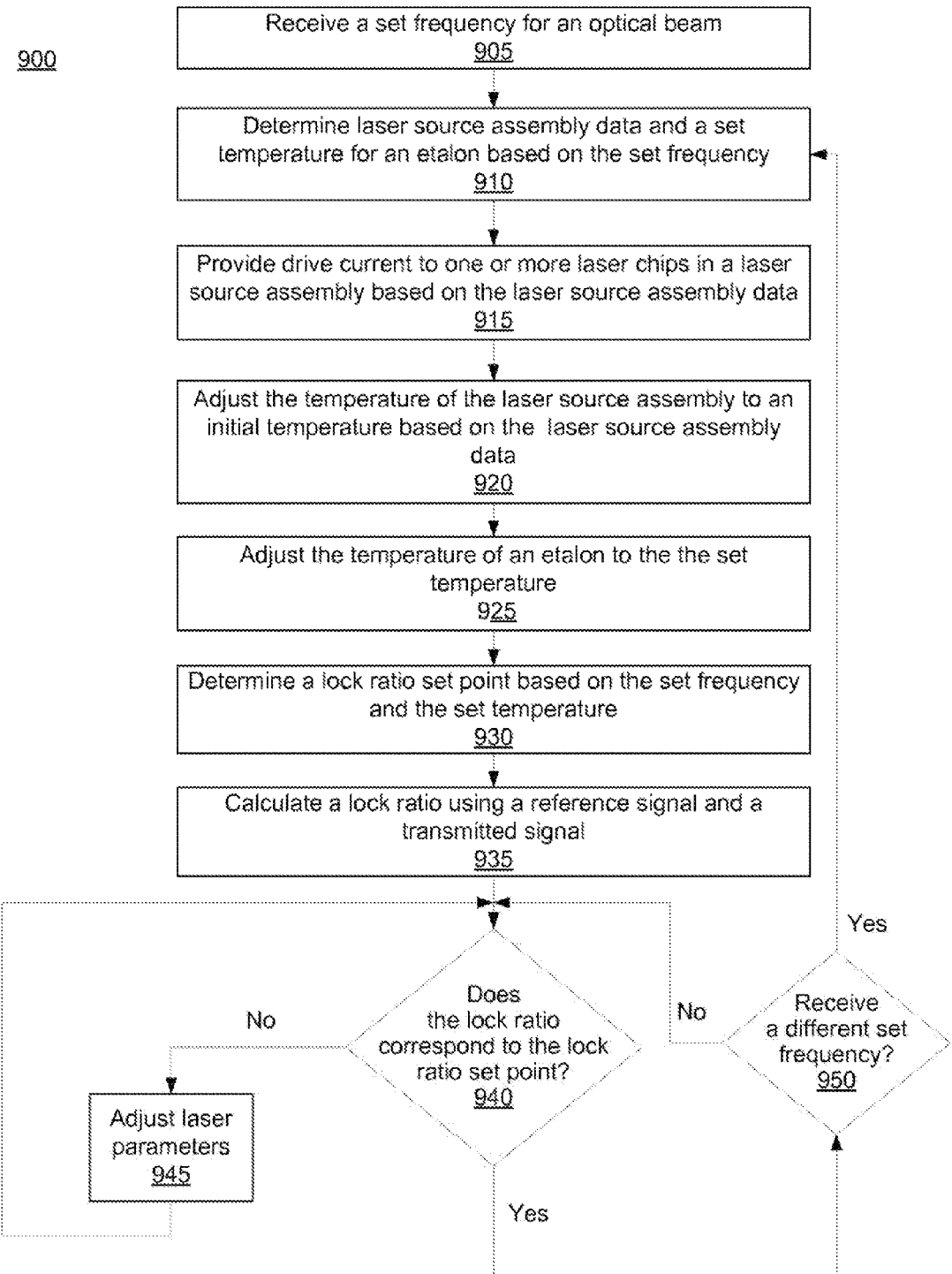
FIG. 9 illustrates a flowchart of one embodiment of a process for setting a frequency of an optical beam produced by a thermal locker system using a controller of a thermal locker system according to an embodiment.

FIG. 9 illustrates a flowchart of one embodiment of a process 900 for setting a frequency of an optical beam produced by a thermal locker system 100 using a controller 110 of a thermal locker system 100 according to an embodiment. Other entities may perform some or all of the steps of the process in other embodiments. Likewise, embodiments may include different and/or additional steps, or perform the steps in different orders.

The controller 110 receives 905 a set frequency for an optical beam to be produced by a laser source assembly 115. The set frequency is the desired frequency of the optical beam 116 output from the laser source assembly 115. For example, a user may provide a set frequency of 194,000 GHz or the corresponding wavelength 1.546 μm.

The controller 110 determines 910 laser source assembly data and a set temperature for the etalon based on the set frequency. The controller 110 can determine the laser source assembly data from one or more lookup tables. The retrieved laser source assembly data includes drive current settings for one or more laser chips and/or sections within the laser source assembly 115 and an initial temperature value for the laser chips, whose combination corresponds to the set frequency. The set temperature for the etalon is determined using the process described above with respect to FIG. 6.

The controller 110 then provides 915 the drive current to one or more laser chips in the laser source assembly 115 based on the laser source assembly data. The laser source assembly then produces one or more output beams at an initial frequency, e.g., a rear beam 118 and a forward beam 116.

The controller 110 adjusts 920 the temperature of the laser source assembly 115 to an initial temperature based on the laser source assembly data. The controller 110 sends signals to the temperature regulator 125 to heat or cool the submount 120 based on the retrieved data. The controller 110 uses signals received from the submount temperature detector 155 to determine when the submount 120, and hence the one or more laser chips, reach the initial temperature. In one embodiment, the controller 110 holds the temperature of the one or more laser chips at the initial temperature, or some other temperature determined by the controller 110, via a proportional-integral-derivative (PID) algorithm. Note, in alternate embodiments, the controller 110 may provide 915 drive current to the one or more laser chips in the laser source assembly 115 in conjunction with, or before, the heating of the laser source assembly in step 920.

The controller 110 adjusts 925 the temperature of an etalon to the set temperature. The controller 110 sends signals to the etalon heater 165 to heat or cool the etalon 160. The controller 110 uses signals received from the etalon temperature detector 170 to determine that the etalon 160 reaches the set temperature. In one embodiment, the controller 110 holds the temperature of the etalon 160 at the set temperature via a PID algorithm.

The controller 110 determines 930 a lock ratio set point based on the set frequency and the set temperature. In some embodiments, the controller 110 retrieves the lock ratio set point from one or more lookup tables. Additionally, in some embodiments, the lock ratio set point may be calculated/interpolated from a limited set of calibration points. The controller 110 calculates 935 a lock ratio using a reference signal ($R_{xMon}$) and a transmitted signal ($T_{xMon}$) received from a reference detector 145 and a transmission detector 150, respectively.

The initial frequency of the one or more output beams is ideally the same as the set frequency, however, there may be some unintended deviation from the set frequency initially and/or sometime during operation of the thermal locker system 100. Any unintended deviation from the set frequency is identified using the etalon assembly 140, and corrected by adjusting the drive current provided to the laser source assembly 115 and/or adjusting the temperature of the laser source assembly 115.

The controller 110 determines 940 whether the calculated lock ratio corresponds to the lock ratio set point. If the lock ratio set point does not overlap with the calculated lock ratio, the controller 110 adjusts 945 one or more of the laser parameters to shift the calculated lock ratio such that it again overlaps with the lock ratio set point. There is an inverse relationship between temperature of the one or more laser chips and the frequency of the one or more output beams. The controller 110 may adjust the temperature of the one or more laser chips via the temperature regulator 125 and/or adjust the drive current provided to the one or more laser chips. An increase in drive current and/or temperature of the one or more laser chips results in a decrease in frequency of the one or more output beams. Similarly, a decrease in drive current and/or temperature of the one or more laser chips results in an increase in frequency of the one or more output beams. If the calculated lock ratio and the lock ratio set point correspond, the output beam is at the set frequency. Accordingly, the one or more laser parameters may be adjusted to cause the calculated lock ratio to overlap with the lock ratio set point. At some point, a user may want to change the set frequency to a different frequency value. For example, the user may wish to lock the thermal locker system 100 to a different frequency. The controller 110 determines whether a different set frequency is received 950. If controller 110 receives a different set frequency, the process flow moves to step 910 using the different set frequency. Otherwise, the process flow moves to step 940.

Additional Configuration Considerations

The foregoing description of the embodiments has been presented for the purpose of illustration; it is not intended to be exhaustive or to limit the disclosure to the precise forms disclosed. Persons skilled in the relevant art can appreciate that many modifications and variations are possible in light of the above disclosure.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Additionally, the language used in the specification has been principally selected for readability and instructional purposes, and it may not have been selected to delineate or circumscribe the inventive subject matter. It is therefore intended that the scope of the embodiments be limited not by this detailed description, but rather by any claims that issue on an application based hereon. Accordingly, the disclosure of the embodiments is intended to be illustrative, but not limiting, of the scope of the disclosure, which is set forth in the following claims.

Finally, in the claims, reference to an element in the singular is not intended to mean "one and only one" unless explicitly stated, but rather is meant to mean "one or more." In addition, it is not necessary for a device or method to address every problem that is solvable by different embodiments of the invention in order to be encompassed by the claims.

The invention claimed is:

1. An assembly comprising:
an etalon assembly consisting of a single etalon for dynamically locking a frequency of an optical beam to a set frequency, the set frequency being selected from a plurality of set frequencies within a frequency band divided into a frequency grid, and the plurality of frequencies include on-grid frequencies associated with channels and off-grid frequencies that are not associated with channels, the etalon assembly being external to a laser source assembly that outputs the optical beam, the etalon assembly comprising:
an etalon that receives the optical beam and generates via interference effects a transmission beam, wherein the transmission beam is a periodic function that depends on the temperature of the etalon, and a thermal tuning range of the etalon is greater than one half of a free spectral range of the etalon, and
an etalon heater mounted to the etalon such that the etalon heater is configured to adjust the temperature of the etalon; and
a controller configured to:
retrieve calibration data based on the set frequency, wherein the controller is further configured to:
locate a calibration point, of a plurality of calibration points, nearest the set frequency, wherein the plurality of calibration points are distributed across a frequency band divided up into segments that each have a bandwidth at least as large as the thermal tuning range of the etalon, and at least one calibration point is located within each segment, and
retrieve the located calibration point and an associated calibration temperature ($T_{nom}$); and
calculate a set temperature for the etalon using a thermal tuning algorithm and the calibration data, and
control the etalon heater such that the etalon has a temperature equal to the calculated set temperature.

2. The assembly of claim 1, wherein the etalon has a thermal optic coefficient within the range 2 to 4 GHz/C, and a thermal conductivity greater than 10 W/m·K.

3. The assembly of claim 2, wherein the etalon is a single crystal of yttrium aluminum garnet.

4. The assembly of claim 1, wherein the etalon assembly further comprises a thermally conductive shroud that surrounds a portion of etalon and is in contact with the etalon heater, and the shape of the shroud is designed to provide a uniform thermal profile to the etalon.

5. The assembly of claim 1, wherein the etalon heater is a resistive heater.

6. The assembly of claim 5, wherein the etalon assembly further comprises:
an insulator that is mounted to the bottom of the etalon heater and is mounted to a submount at a temperature different than the etalon heater in a manner to insulate the etalon heater from the submount, the insulator comprising at least one air gap between a portion of the insulator and the etalon heater.

7. A method comprising:
receiving a set frequency, the set frequency being selected from a plurality of set frequencies within a frequency band divided into a frequency grid, and the plurality of frequencies include on-grid frequencies associated with channels and off-grid frequencies that are not associated with channels;
retrieving calibration data based on the set frequency, wherein retrieving the calibration data based on the set frequency includes:
locating a calibration point, of a plurality of calibration points, nearest the set frequency, wherein the plurality of calibration points are distributed across a frequency band divided up into segments that each have a bandwidth at least as large as the thermal tuning range of the etalon, and at least one calibration point is located within each segment, and
retrieving the located calibration point and an associated calibration temperature ($T_{nom}$); and
calculating a set temperature for an etalon within an etalon assembly consisting of a single etalon using a thermal tuning algorithm and the calibration data, wherein a thermal tuning range of the etalon is greater than one half of a free spectral range of the etalon; and
controlling the etalon assembly such that the etalon has a temperature equal to the calculated set temperature to dynamically lock a frequency of an optical beam to the set frequency.

8. The method of claim 7, wherein the thermal tuning algorithm comprises:

$$v_{i,j}=v_{i,o}+dv/dT(T_{nom}-T_j)$$

where $dv/dT$ is the etalon frequency change with temperature, $v_{i,o}$ is the calibration point, $T_j$ is the temperature of the etalon, and $v_{i,j}$ is the set frequency.

9. The method of claim 7, wherein the thermal tuning algorithm comprises:

$$v_{i,j}=v_{i,o}+dv'/dT(T_{nom}-T_j)$$

where v is frequency, $dv'/dT$ is a function of frequency, $v_{i,o}$ is the calibration point, $T_j$ is the temperature of the etalon, and $v_{i,j}$ is the set frequency.

10. The method of claim 7, wherein the thermal tuning algorithm comprises:

$$v_{i,j}=v_{i,o}+dv'/dT(T_{nom}-T_j)(1-\delta)$$

where v is frequency, $dv'/dT$ is a function of frequency, $v_{i,o}$ is the calibration point, $T_j$ is the temperature of the etalon, and $v_{i,j}$ is the set frequency, and where $\delta$ is a temperature offset correction factor.

11. The method of claim 7, wherein the frequency band is the C-band.

12. An assembly comprising:
a laser source assembly that produces an output beam at an initial frequency, where the initial frequency is dependent on one or more laser parameters;
a redirection assembly that splits an output beam into a reference beam and a redirected beam;
a reference detector that monitors the reference beam, producing a reference signal proportional to the optical intensity of the reference beam;
an etalon assembly comprising:
an etalon that receives the redirected beam and generates via interference effects a transmission beam, the etalon being a single crystal, and the transmission beam being dependent on a temperature of the etalon, and
an etalon heater that adjusts the temperature of the etalon; and
a transmission detector that monitors the transmission beam, producing a transmission signal proportional to the optical intensity of the transmission beam; and a controller configured to:
control the laser source assembly in accordance with the one or more laser parameter settings, such that the initial frequency is at or near a set frequency the set frequency being selected from a plurality of set frequencies within a frequency band divided into a frequency grid, and the plurality of frequencies include on-grid frequencies associated with channels and off-grid frequencies that are not associated with channels,
determine a temperature of the etalon that corresponds to the set frequency,
control the etalon heater such that the etalon is at the determined temperature,
calculate a lock ratio using the reference signal and the transmitted signal, and
adjust one or more of the one or more laser parameters until the lock ratio corresponds to a calibrated lock ratio for the set frequency.

13. The assembly of claim 12, wherein the etalon has a thermal optic coefficient within the range 2 to 4 GHz/C, and a thermal conductivity greater than 10 W/m·K.

14. The assembly of claim 13, wherein the etalon is a single crystal of yttrium aluminum garnet.

15. The assembly of claim 12, wherein the one or more laser parameters include a drive current for the laser source assembly and a laser source assembly temperature value.

16. The assembly of claim 15, further comprising:
a thermally conductive submount comprising a first surface and a second surface opposite the first surface, wherein the laser source assembly is mounted to the first surface of the submount; and
a temperature regulator that is mounted to the second surface of the submount, and is configured to adjust the submount to the laser source assembly temperature value.

17. The assembly of claim 12, wherein the controller is further configured to:
receive a second set frequency that is different from the first set frequency;
control the laser source assembly in accordance with the one or more laser parameter settings, such that the initial frequency is at or near the different set frequency;
determine a second temperature of the etalon that corresponds to the different set frequency;
control the etalon heater such that the etalon is at the second temperature;
calculate a second lock ratio using the reference signal and the transmitted signal; and
adjust one or more of the one or more laser parameters until the lock ratio corresponds to a calibrated lock ratio for the second set frequency.

18. The assembly of claim 12, wherein the redirection assembly comprises:
a first reflecting surface configured to change the direction of a portion of the output beam by 90 degrees such that it is propagating vertically, and transmit a remaining portion of the output beam toward the reference monitor as the reference beam; and
a second reflecting surface, vertically offset from the first reflecting surface, configured to redirect the beam in a direction parallel to, and vertically offset from the output beam, to create the redirected beam.

19. The assembly of claim 18, wherein the redirection assembly comprises:
a linear polarizer positioned to polarize the output beam prior to it being incident on the first reflecting surface; and
a quarter-wave plate positioned to rotate the polarization of the redirected beam by 45 degrees and rotate a back reflection by an additional 45 degrees such that the rotated back reflection is orthogonal to the orientation of the linear polarizer.

* * * * *